United States Patent
Tailliet

(10) Patent No.: US 9,978,452 B2
(45) Date of Patent: *May 22, 2018

(54) METHOD FOR WRITING IN AN EEPROM MEMORY AND CORRESPONDING DEVICE

(71) Applicant: STMicroelectronics (Rousset) SAS, Rousset (FR)

(72) Inventor: François Tailliet, Fuveau (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/682,102

(22) Filed: Aug. 21, 2017

(65) Prior Publication Data

US 2017/0345502 A1    Nov. 30, 2017

Related U.S. Application Data

(63) Continuation of application No. 15/221,318, filed on Jul. 27, 2016, now Pat. No. 9,779,815.

(30) Foreign Application Priority Data

Feb. 22, 2016   (FR) ..................................... 16 51431

(51) Int. Cl.

| G11C 16/04 | (2006.01) |
| H01L 27/11526 | (2017.01) |
| H01L 29/788 | (2006.01) |
| G11C 16/14 | (2006.01) |
| G11C 16/10 | (2006.01) |
| H01L 27/11521 | (2017.01) |

(52) U.S. Cl.
CPC .......... *G11C 16/0408* (2013.01); *G11C 16/10* (2013.01); *G11C 16/14* (2013.01); *H01L 27/11521* (2013.01); *H01L 27/11526* (2013.01); *H01L 29/7883* (2013.01)

(58) Field of Classification Search
CPC ..... G11C 16/0408; G11C 16/10; G11C 16/14; H01L 27/11521; H01L 27/11526
USPC .................................................... 365/185.18
See application file for complete search history.

(56) References Cited

U.S. PATENT DOCUMENTS

| 4,695,979 A | 9/1987 | Tuvell et al. |
| 4,935,648 A | 6/1990 | Radjy et al. |
| 6,266,278 B1 * | 7/2001 | Harari ................. G11C 11/5621 257/E27.103 |
| 6,795,347 B2 | 9/2004 | Ausserlechner et al. |
| 2015/0348640 A1 | 12/2015 | La Rosa et al. |

\* cited by examiner

*Primary Examiner* — Huan Hoang
(74) *Attorney, Agent, or Firm* — Slater Matsil, LLP

(57) ABSTRACT

A method can be used for writing in a memory location of the electrically-erasable and programmable memory type. The memory location includes a first memory cell with a first transistor having a first gate dielectric underlying a first floating gate and a second memory cell with a second transistor having a second gate dielectric underlying a second floating gate that is connected to the first floating gate. In a first writing phase, an identical tunnel effect is implemented through the first gate dielectric and the second gate dielectric. In a second writing phase, a voltage across the first gate dielectric but not the second gate dielectric is increased.

20 Claims, 2 Drawing Sheets

| | | VBL$_R$ | VBL$_B$ | VWL | VCG | VFG | VSL$_R$ | VSL$_B$ |
|---|---|---|---|---|---|---|---|---|
| EFF | Pe1 | 0 | 0 | 0 | VppE=12 | VFGE1=8,6 | 0 | 0 |
| | Pe2 | 0 | VboostE=12 | 12 | VppE=12 | VFGE2=10 | 0 | 12 |
| PRG | Pp1 | VppP=12 | VppP=12 | 15 | 0 | VFGP1=3,4 | 5 | 5 |
| | Pp2 | VppP=12 | VboostP=2 | 15 | 0 | VFGP2=2 | 5 | 1 |

|  |  | VBL_R | VBL_B | VWL | VCG | VFG | VSL_R | VSL_B |
|---|---|---|---|---|---|---|---|---|
| EFF | Pe1 | 0 | 0 | 0 | VppE=12 | VFGE1=8,6 | 0 | 0 |
|  | Pe2 | 0 | VboostE=12 | 12 | VppE=12 | VFGE2=10 | 0 | 12 |
| PRG | Pp1 | VppP=12 | VppP=12 | 15 | 0 | VFGP1=3,4 | 5 | 5 |
|  | Pp2 | VppP=12 | VboostP=2 | 15 | 0 | VFGP2=2 | 5 | 1 |

METHOD FOR WRITING IN AN EEPROM MEMORY AND CORRESPONDING DEVICE

CROSS-REFERENCE TO RELATED APPLICATIONS

This application is a continuation of U.S. patent application Ser. No. 15/221,318 entitled, "Method for Writing in an EEPROM Memory and Corresponding Device," filed on Jul. 27, 2016, which application claims priority to French Application No. 1651431, filed on Feb. 22, 2016, which application is hereby incorporated herein by reference.

TECHNICAL FIELD

Various embodiments of the invention and their implementation relate to memories, notably non-volatile memories of the electrically-erasable and programmable (EEPROM) type, and more particularly operations for writing data in these memories.

BACKGROUND

In EEPROM memories, the logical value of a bit stored in a memory location is represented by the value of the threshold voltage of a floating gate transistor, which may be modified at will by write operations. A write operation generally comprises an erase step followed by a programming step.

However, in certain cases, the write operation may comprise only an erase step or only a programming step. Thus, if, for example, the word to be written only contains "o"s, then only an erase step is needed. If the previous content of the memory location in which it is desired to write a digital word already contains only "o"s, then the erase step is unnecessary.

The programming or the erasing of a floating gate transistor consists of the injection or the extraction of electrical charges into/from the floating gate of the transistor by tunnel effect ("Fowler-Nordheim effect") through the gate oxide called "tunnel oxide", by means of a high voltage pulse Vpp which can be of the order of 10 to 20 volts, typically 13 volts.

This high voltage of 13 volts needed for the writing of EEPROM memories is non-reducible and is very constraining with regard to the technological processes and the reliability of the product.

Indeed, lithographic reduction, in other words an increase in the etch resolution, leads to a decrease in the operating voltages, and this high write voltage becomes more problematic with regard notably to leakages from the source/drain junctions of the transistors and also to breakdown of the tunnel oxides.

Consequently, these risks of breakdown and of premature aging of the transistors have a direct impact on the reliability of the product and the maximum high voltage Vpp applicable is limited by the robustness of the memory cells.

Furthermore, when the voltage Vpp comes close to the maximum permitted voltages for the components in question, high leakage currents appear, generally by avalanche effect. These currents increase dramatically above a certain threshold and a charge pump can no longer supply them. This can lead to an under-erasing or an under-programming, and these risks of leakages thus have a direct impact on the functionality of the circuit.

The electric field needed to obtain a tunnel current by "Fowler-Nordheim effect" is notably proportional to the applied voltage Vpp, to the drain-floating gate coupling factor and to the inverse of the thickness of the layer of tunnel oxide.

Maximizing the coupling factor of the memory cells and minimizing the thickness of the tunnel oxide have provided a partial solution to this problem, but these techniques have attained their maximum possibilities (coupling factor exceeding 80% and thickness of tunnel oxide less than 70 Å).

An increase in the duration of application of the erase and programming pulses is limited because it can lead to unacceptable write times.

Consequently, it is in particular the write problems that pose a barrier to the development of modern technologies of non-volatile memories of the EEPROM type.

Furthermore, there exists a need for low power operation of memories, and hence to limit the value of the voltages implemented, notably for autonomous systems powered by small batteries, such as hearing aids, or for radiofrequency identification "RFID" tags.

Thus, it is desirable to reduce this high voltage Vpp, while at the same time ensuring a reliable and efficient writing of the data into the memory locations.

SUMMARY

According to one embodiment and its implementation, the idea is to locally stimulate the potential of the floating gate of a memory cell, in order to increase the electric field passing through the tunnel oxide.

It then notably becomes possible for the same high voltage to increase the efficiency of programming or of erasing by increasing the quantity of charges injected into or extracted from the floating gate, or else to conserve the same efficiency of programming or of erasing by applying a lower voltage.

Thus, a memory location is advantageously provided comprising two memory cells whose state transistors have their floating gates connected together, the idea being to use one of the memory cells as a "boost cell" in order to stimulate the other memory cell referred to as "regular cell".

According to one embodiment and its implementation, a distribution over time of the stresses in terms of endurance of the two memory cells is advantageously provided.

According to one aspect, a write process is provided in a memory location of the electrically-erasable and programmable memory type, comprising at least one operation (or cycle) for writing a data value comprising an erase step and/or a programming step, each using a tunnel effect.

According to a general feature of this aspect, the memory location comprises a first memory cell comprising a first transistor having a first oxide underneath a first floating gate and a second memory cell comprising a second transistor having a second oxide underneath a second floating gate connected to the first floating gate.

Moreover, the erase step and/or the programming step each comprise a first phase in which an identical tunnel effect is implemented through each oxide, and a second phase in which the voltage across the terminals of one of the first and second oxides is increased, while at the same time decreasing the voltage across the terminals of the other oxide of the other transistor of the other memory cell (which thus plays the role of memory cell).

According to one embodiment, in which each of the transistors furthermore comprises a control gate, the erase step comprises, during the first phase, the application of an erase voltage to the control gates of the first and the second transistors and the application of a zero voltage to their drains and, during the second phase, the maintaining of a zero voltage on the drain of one of the first and second transistors and the application of a first auxiliary voltage to the drain of the other transistor of the other memory cell, having a value chosen so as to increase the potential of the floating gate of this other transistor.

The first auxiliary voltage may be equal to or less than the erase voltage.

Thus, during the first phase, the two floating gate transistors are erased in a similar manner, receiving the same erase pulse and contributing uniformly to the erasing.

During the second phase, if it is assumed, for example, that the second memory cell is the boost cell, the drain voltage of the second floating gate transistor increases, halting the flow of tunnel current and increasing, by capacitive coupling, the potential of the floating gate. The voltage across the first oxide is therefore raised, increasing the tunnel current as a result.

In other words, the application of the first auxiliary voltage to the drain of the second transistor leads to a potential difference being obtained between the floating gate and the drain of this second transistor that is insufficient to generate a tunnel current.

According to one embodiment, the programming step comprises, during the first phase, the application of a programming voltage to the drain of the first transistor and to the drain of the second transistor, and, during the second phase, the application of the programming voltage to the drain of one of the first and second transistors and of a second auxiliary voltage to the drain of the other transistor having a value chosen so as to reduce the potential of the floating gate of this other transistor.

Thus, during the first phase, the two floating gate transistors are programmed in a similar manner, receiving the same programming pulse and contributing uniformly to the programming.

During the second phase, still assuming, for example, that the second memory cell is the boost cell, the drain voltage of the second floating gate transistor decreases, halting the flow of tunnel current and lowering, by capacitive coupling, the potential of the floating gate, and consequently the voltage across the first oxide is raised.

Here again, the potential difference between the floating gate and the drain of the second transistor is, in the second phase, insufficient for generating a tunnel current.

Advantageously, the value of the second auxiliary voltage is non-zero.

This notably allows the current leakages between neighboring bit lines to be avoided.

The erase step may be followed by the programming step.

According to one embodiment, the other memory cell (in other words the boost memory cell) may be the same in the erase step and in the programming step.

However, the memory cell referred to as "regular" is more stressed in terms of endurance than the boost memory cell, since the tunnel current flows through its tunnel oxide during the two erase and programming phases.

It can accordingly be advantageous, in some applications, to interchange, for example, at chosen moments in time, the roles of the two memory cells of the memory location.

Thus, for example, the other memory cell (the boost memory cell) may be different in the erase step and in the programming step.

Furthermore, in one embodiment comprising several successive write operations (or cycles), the other memory cell (the boost memory cell) may, for example, advantageously be different from one write operation to another.

According to another aspect, a memory device of the electrically-erasable and programmable memory type is provided, comprising at least one memory location comprising a first memory cell comprising a first transistor having a first oxide underneath a first floating gate and a second memory cell comprising a second transistor having a second oxide underneath a second floating gate connected to the first floating gate and a controller configured for carrying out at least one operation for writing a data value in the memory location comprising an erase and/or a programming step implementing, in a first phase, an identical tunnel effect through each oxide and, in a second phase, an increase of the voltage across the terminals of one of the first and second oxides and a decrease of the voltage across the terminals of the other oxide of the other transistor of the other memory cell.

According to one embodiment, in which each of the transistors furthermore comprises a control gate, the controller is configured for implementing the erasing by applying, during the first phase, an erase voltage to the control gates of the first and of the second transistor and a zero voltage to their drains, and by applying, during the second phase, a zero voltage to the drain of one of the first and second transistors and a first auxiliary voltage to the drain of the other transistor of the other memory cell, having a value chosen so as to increase the potential of the floating gate of this other transistor.

The first auxiliary voltage may be equal to the erase voltage.

According to one embodiment, the controller are configured for implementing the programming by applying, during the first phase, a programming voltage to the drain of the first transistor and to the drain of the second transistor, and by applying, during the second phase, the programming voltage to the drain of one of the first and second transistors and a second auxiliary voltage to the drain of the other transistor of the other memory cell, having a value chosen so as to decrease the potential of the floating gate of this other transistor.

The controller may be configured so that the value of the second auxiliary voltage is non-zero.

The controller may be configured for carrying out the at least one write operation comprising the erase step followed by the programming step.

According to one embodiment, the controller is configured for carrying out the at least one write operation with the other memory cell being identical or else different in the erase step and in the programming step.

According to one embodiment, the controller is configured for carrying out several successive write operations with the other memory cell being different from one write operation to another.

BRIEF DESCRIPTION OF THE DRAWINGS

Other advantages and features of the invention will become apparent upon examining the detailed description of embodiments and their implementation, which are non-limiting, and from the appended drawings in which.

DETAILED DESCRIPTION OF ILLUSTRATIVE EMBODIMENTS

Figure 1:
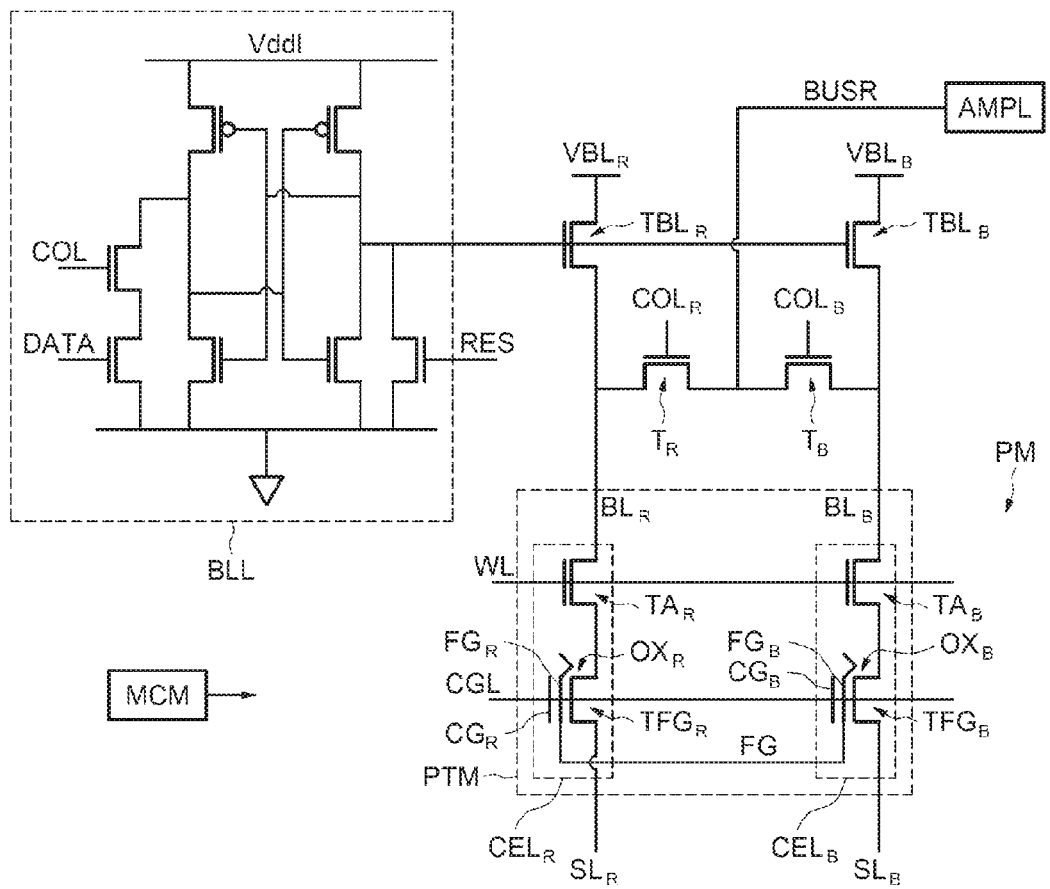
FIGS. 1 to 5 show schematically embodiments of a memory device and their implementation according to the invention.

FIG. 1 shows one embodiment of a memory device of the EEPROM type comprising a memory location PTM in a memory plane PM, together with other elements for implementation such as a bit line latch BLL, controller MCM and switching elements notably connecting the memory plane PM to a read amplifier AMPL via a read bus BUSR.

The read amplifier AMPL is notably configured for reading the content of the bit stored in the memory location PTM.

The memory location PTM comprises two identical memory cells CELR, CELB. The first memory cell CELR is referred to as "regular cell", whereas the second memory cell CELB is referred to as a "boost cell".

The regular memory cell CELR comprises a first state transistor referred to as "regular" TFGR and a first access transistor TAR controlled by a signal delivered over a word line WL, and connected on its drain to a first bit line BLR. The source of this first access transistor TA is connected to the drain of the first state transistor TFGR.

The first state transistor TFGR is controlled on its control gate CGR by a signal delivered over a control line CGL. The first state transistor TFGR comprises a first floating gate FGR on top of a first layer of oxide OXR, whose part facing the drain of the transistor TFGR is called tunnel oxide. On the other hand, the source of the first state transistor TFGR is connected to a source line SLR.

Similarly, the boost memory cell CELB comprises a second state transistor referred to as "boost state transistor" TFGB and a second access transistor TAB controlled by the signal delivered over the word line WL, connected on its drain to a second bit line BLB and on its source to the drain of the second state transistor TFGB.

The boost state transistor TFGB is controlled on its control gate CGB by the signal delivered by the control line CGL and comprises a second floating gate FGB on top of a second layer of oxide OXB, whose part facing its drain is also called tunnel oxide. On the other hand, the source of the state transistor TFGB is connected to a source line SLB.

Furthermore, the respective floating gates FGR, FGB of the state transistors are connected together, forming a common floating gate FG.

For the sake of simplification, only one memory location PTM has been shown and conventional circuitry that is not indispensable to the understanding of the invention have purposely not been shown.

It recalled here that, during a conventional step for erasing a memory cell, an erase voltage (high voltage) is applied to the control gate of the state transistor of the cell and a zero voltage is applied to the drain of the state transistor.

During a conventional programming step, a programming voltage (high voltage) is applied to the drain of the state transistor and a zero voltage is applied to the control gate of the state transistor.

As will be seen in more detail hereinafter, one of the two cells of the memory location, for example, the first cell, will undergo a conventional erase and/or programming step, whereas the other cell of the memory location, for example, the second cell, will undergo a conventional erase and/or programming step during a first phase, then during a second phase, the voltage across the terminals of the second oxide will be decreased so as to "boost" the potential of the common floating gate, in other words to modify it in such a manner as to increase the voltage across the terminals of the first oxide and, in a correlated manner, to improve the tunnel effect of the first cell.

Although, in the example described here, the cell that will "boost" the other is the second, it may of course be envisaged, by symmetry, for it to be the first that "boosts" the second.

The latch BLL conventionally comprises two cross-connected inverters and can thus store a data value, for example, with the aim of writing it in a memory location. The data value is loaded beforehand into the latch by signals DATA and COL delivered by the controller MCM. A reset transistor controlled by a signal RES conventionally allows a "o" to be forced onto the output of the latch BLL.

The output of the latch BLL controls two transistors TBLR and TBLB configured for applying the programming signals VBLR and VBLB, for example, also delivered by controller MCM, to the respective bit lines BLR and BLB.

The switching elements comprise, in this representation, the two transistors TBLR and TBLB, together with two transistors TR, TB controlled by respective signals COLR and COLB, also delivered by the controller MCM, and connected between the respective bit lines BLR, BLB and the read bus BUSR.

Figure 2:
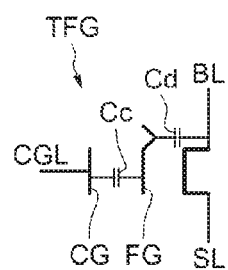

FIG. 2 shows either one of the state transistors TFGR, TFGB of the memory location PTM in FIG. 1, which here is referenced TFG.

The transistor TFG comprises a control gate CG connected to the control line CGL, a floating gate FG, a drain connected to a bit line BL and a source connected to a source line SL.

As shown in FIG. 2, there is a coupling capacitor Cc between the control gate CG and the floating gate FG, and also a capacitor Cd between the floating gate FG and the drain of the transistor TFG.

Figure 3:
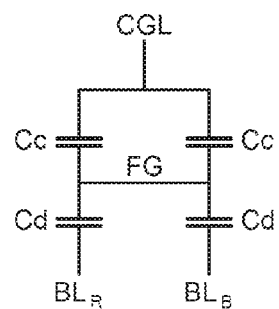

Thus, the common floating gate FG within the memory location PTM is incorporated into an equivalent capacitive circuit, shown in a simplified manner in FIG. 3, ignoring the channel capacitance of the transistor TFG relative to capacitances Cc and Cd. This equivalent capacitive circuit is controlled by the signals present on the bit lines BLR and BLB and also on the control line CGL.

In the following part, VCG, VFG, VBLR and VBLB respectively denote the voltages present on the control line CGL, on the common floating gate FG, on the bit line BLR and on the bit line BLB.

Based on the representation in FIG. 3, it is straightforward to obtain the equation (I):

$$VFG \approx VCG \times Cc/(Cc+Cd) + VBLR \times Cd/2(Cc+Cd) + VBLB \times Cd/2(Cc+Cd) \quad (I)$$

Figures 4, 5:
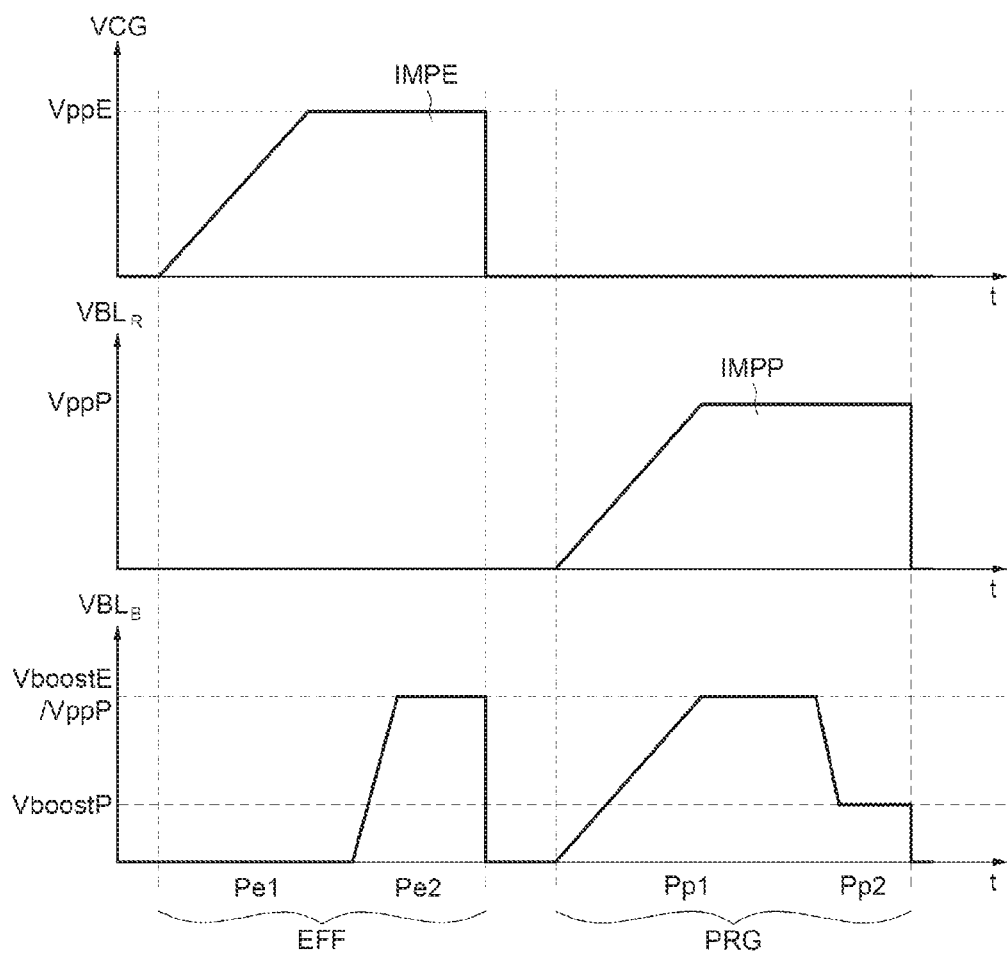

FIG. 4 is a table of values in volts (V) representing the floating gate potential VFG during the erase EFF and programming PRG steps.

The potential VFG is established as a function of the voltages VCG, VBLR, VBLB, VWL, VSLR and VSLB and from the equation (I), the voltages VWL, VSLR, VSLB respectively denoting the voltages present on the word line WL and on the source lines SLR and SLB.

The values in this table are given by way of example and the voltages VFG on the floating gate correspond to a numerical application of the equation (I) with the voltage values from the table and Cc=1 and Cd=0.4.

FIG. 5 shows the profiles of the voltages VCG, VBLR, VBLB, respectively applied to the control line CGL and to the drains of the regular state transistors TFGR and boost transistors TFGB, in the example in FIG. 4.

This example comprises an erase step EFF comprising a first phase Pe1 and a second phase Pe2, followed by a programming step PRG comprising a first phase Pp1 and a second phase Pp2.

The voltages are usually generated by charge pumps and have the profile of a ramp followed by a plateau at the desired voltage.

During the erase EFF and of programming PRG steps, the tunnel current is controlled by the potential difference between the floating gate and the drain of a state transistor.

During the first phase Pe1 of the erase step EFF, an erase voltage with a value VppE=12V is applied to the control gates of the state transistors TFGR and TFGB.

The drains of the state transistors TFGR and TFGB are at respective zero potentials VSLR and VSLB, delivered over the source lines SLR and SLB. The potentials VSLR and VSLB are transmitted to the drains by the state transistors TFGR and TFGB forced into the conducting state, owing to the high voltage VCG=VppE on the control line CGL.

As a consequence, during the first phase Pe1, the common floating gate FG climbs to a potential VFGE1=8.6V by capacitive coupling, by applying the equation (I).

The potential difference between the floating gates FGR, FGB and the drains of the respective transistors is therefore 8.6V, and the erase process is carried out conventionally and in an identical fashion on the two state transistors TFGR and TFGB.

During the second phase Pe2 of an erase step EFF, the erase voltage VppE continues to be applied to the control gates of the state transistors of the memory location.

Furthermore, an auxiliary voltage is applied to the drain of the boost state transistor TFGB. This auxiliary voltage is delivered by the source of voltage VBLB at a value VboostE=12V, via the bit line BLB and the access transistor TAB rendered conducting by a voltage VWL=12V on its gate. The resulting voltage on the drain of the boost state transistor TFGB is substantially equal to 10V.

The voltage present on the drain of the regular state transistor TFGR is zero, in the same way as during the first phase Pe1.

As a consequence, during the second phase Pe2, the common floating gate FG climbs to a potential VFGE2=10V by capacitive coupling, by applying the equation (I).

The potential difference between the floating gate FGR of the regular state transistor TFGR and its drain is thus substantially equal to 10V. The potential difference between the floating gate FGB of the boost state transistor TFGB and its drain is virtually zero, insufficient for generating a tunnel current.

The erase process is therefore carried out on the regular state transistor TFGR alone during the second erase phase, with a potential difference between its floating gate FGR and its drain increased by 1.4V with respect to a usual process.

Since the tunnel current is exponentially dependent on the tunnel voltage, this gain of 1.4V on the floating gate potential FG dominates, as regards the injection of charges into the floating gate FG, over the absence of current through the tunnel oxide OXB of the boost transistor TFGB in this second phase Pe2 of the erase step.

During the first phase Pp1 of the programming step, a programming voltage with a value VppP=12V is applied to the drains of the regular state transistor TFGR and boost state transistor TFGB.

This voltage VppP is delivered by the sources of voltages VBLR and VBLB via the bit lines BLR and BLB and the access transistors TAR and TAB rendered conducting by the signal VWL=15V applied to their gates.

The control gates CGR and CGB of the state transistors TFGR and TFGB are at a potential VCG=0V delivered on the control line CGL.

As a consequence, during the first phase Pp1, the common floating gate FG goes to a potential VFGP1=3.4V by capacitive coupling, by applying the equation (I).

The potential difference between the floating gates FGR, FGB and the drains of the respective state transistors is therefore 8.6V, and the process of programming is carried out conventionally and in an identical fashion on the two state transistors TFGR and TFGB.

During the second phase Pp2 of the programming step PRG, a second auxiliary voltage VboostP, lower than the programming voltage, is applied to the drain of the boost state transistor TFGB in place of the programming voltage VppP.

The transition of the programming voltage VppP to the second auxiliary voltage VboostP may advantageously take the form of a falling ramp.

Generally speaking, the application of ramps for the voltage transitions allows the impact of the tunnel current peaks to be reduced, by distributing the current more uniformly over time, with respect to an abrupt transition.

The voltage present on the drain of the regular state transistor TFGR is the programming voltage VppP, in the same way as during the first phase Pp1.

Advantageously, the value of the second auxiliary voltage VboostP is not zero, for example, equal to 2V. This allows current leakages between neighbouring bit lines to be avoided and does not significantly degrade the "boost" effect of the potential VFG of the common floating gate FG.

As a consequence, during the second phase Pp2, the common floating gate FG falls to a potential VFGP2=2V by capacitive coupling, by applying the equation (I).

The potential difference between the floating gate FGR of the regular state transistor TFGR and its drain is thus substantially equal to boy. The potential difference between the floating gate FGB of the boost state transistor TFGB and its drain is therefore almost zero, insufficient for generating a tunnel current.

The programming process is therefore carried out on the regular state transistor TFGR alone during the second phase of programming Pp2, with a potential difference between its floating gate FGR and its drain increased by 1.4V with respect to a usual process.

In a similar manner to during the second phase Pe2 of the erase step, this gain of 1.4V dominates, with regard to the flow of tunnel current, over the absence of current through the tunnel oxide OXB in this second phase Pp2 of the programming step.

Furthermore, the variation of the threshold voltage of a floating gate transistor is proportional to the variation of the potential of the floating gate and to the inverse of the coupling factor between the control gate and the floating gate. Thus, an increase in the floating gate potential increases even more the threshold voltage of an erased state transistor. Similarly, a decrease in the floating gate potential lowers even more the threshold voltage of a programmed state transistor.

As a consequence, as regards the reading of the memory location, such "boosted" erase and/or programming steps allow the value of the threshold voltage of an erased state transistor to be increased by around 2V, and/or the value of the threshold voltage of a programmed state transistor to be decreased by around 2V.

Furthermore, it should be noted that, during the conventional read operation, one and/or the other of the two memory cells of the memory location may be read.

On the other hand, the values of the voltages on the source lines SLR, SLB shown in FIG. 4 notably allow a source-drain voltage to be obtained across the conduction terminals of the state transistors that is still substantially zero during the erase operations, thus avoiding short-circuits from the bit line to the source generally coupled to ground.

In conclusion, the tunnel oxide OXB of the boost state transistor TFGB acts both as a voltage coupling capacitor, allowing the transfer of charge from the regular state transistor to be boosted during the second phases of the erase and programming steps, and as support for the transfer of charges during the first phases, substantially reducing the burden on the tunnel oxide OXR of the regular state transistor TFGR.

The gains obtained in the values of the threshold voltages of a state transistor allow, with respect to the usual technologies, notably: the high voltage Vpp to be reduced for given threshold voltages of an erased or programmed state transistor and/or the thickness of the tunnel oxide layer of the state transistors to be increased for a given high voltage Vpp and a given threshold voltage.

The advantageous consequences of this are notably the reduction in the power consumption or else the use of circuits that cannot tolerate, due to the nature of the fabrication processes, the usual high write voltages (for example, Vpp=13V), and/or an improvement in the retention of the data.

The invention is not limited to the embodiments and their implementation that have just been described but encompasses all their variants.

Thus, in the examples previously presented, a precise role is assigned to each memory cell of the memory location, namely a "regular" role to the first memory cell associated with the first state transistor, and a "boost" role to the second memory cell associated with the second state transistor.

It is however possible to advantageously alternate the roles of the first and second memory cells, in other words to also assign, in some cases, a "regular" role to the second memory cell associated with the second state transistor, and a "boost" role to the first memory cell associated with the first state transistor.

This notably allows the tunnel current to be distributed in one or the other of the first and second tunnel oxides.

Such a permutation of the roles may, for example, be applied between an erase step and a programming step of a write cycle, or else from one write cycle to another.

What is claimed is:

1. A method, comprising:
    applying an erase voltage to a first control gate in a first erasing phase, a first transistor comprising the first control gate, a first floating gate underlying the first control gate, and a first gate dielectric underlying the first floating gate;
    applying the erase voltage to a second control gate in the first erasing phase, a second transistor comprising the second control gate, a second floating gate underlying the second control gate, and a second gate dielectric underlying the second floating gate, wherein the second floating gate is coupled to the first floating gate to form a common floating gate;
    applying a zero voltage to a drain of the first transistor and a drain of the second transistor in the first erasing phase;
    maintaining the first control gate and the second control gate at the erase voltage in a second erasing phase;
    maintaining the drain of the first transistor at the zero voltage in the second erasing phase; and
    applying a first auxiliary voltage to the drain of the second transistor in the second erasing phase.

2. The method of claim 1, wherein applying the erase voltage to the first control gate in the first erasing phase and applying the erase voltage to the second control gate in the first erasing phase comprise simultaneously applying the erase voltage to the first control gate and the second control gate in the first erasing phase.

3. The method of claim 1, wherein the erase voltage comprises a non-zero voltage.

4. The method of claim 1, wherein applying the erase voltage to the first control gate in the first erasing phase and applying the erase voltage to the second control gate in the first erasing phase comprise linearly changing a voltage at the first control gate and at the second control gate from an initial voltage to the erase voltage.

5. The method of claim 4, wherein the initial voltage comprises the zero voltage.

6. The method of claim 1, wherein the first auxiliary voltage is equal to the erase voltage.

7. The method of claim 1, wherein applying the first auxiliary voltage to the drain of the second transistor in the second erasing phase comprises linearly changing a voltage at the drain of the second transistor from the zero voltage to the first auxiliary voltage.

8. The method of claim 1, further comprising:
    applying the zero voltage to the first control gate and the second control gate in a first writing phase;
    applying a program voltage to the drain of the first transistor and the drain of the second transistor in the first writing phase;
    maintaining the first control gate and the second control gate at the zero voltage in a second writing phase;
    maintaining the drain of the first transistor at the program voltage in the second writing phase; and
    applying a second auxiliary voltage to the drain of the second transistor in the second writing phase.

9. The method of claim 8, wherein the second auxiliary voltage comprises a non-zero voltage.

10. The method of claim 8, wherein the second auxiliary voltage is less than the program voltage.

11. The method of claim 8, wherein the program voltage is equal to the erase voltage.

12. The method of claim 8, wherein applying the second auxiliary voltage to the drain of the second transistor in the second writing phase comprises linearly changing a voltage at the drain of the second transistor from the program voltage to the second auxiliary voltage.

13. The method of claim 8, wherein applying the program voltage to the drain of the first transistor and the drain of the second transistor in the first writing phase comprises linearly changing a voltage at the drain of the first transistor and the drain of the second transistor from the zero voltage to the program voltage.

14. A memory device, comprising:
    a memory location comprising:
        a first transistor comprising a first control gate, a first floating gate underlying the first control gate, and a first gate dielectric underlying the first floating gate;
        a second transistor comprising a second control gate, a second floating gate underlying the second control gate, and a second gate dielectric underlying the second floating gate, wherein the second floating gate is coupled to the first floating gate to form a common floating gate;
    a processor; and
    a computer-readable storage medium storing a program to be executed by the processor, the program including instructions for:
        applying an erase voltage to the first control gate and the second control gate in a first erasing phase;

applying a zero voltage to a drain of the first transistor and a drain of the second transistor in the first erasing phase;

maintaining the first control gate and the second control gate at the erase voltage in a second erasing phase;

maintaining the drain of the first transistor at the zero voltage in the second erasing phase; and applying a first auxiliary voltage to the drain of the second transistor in the second erasing phase.

15. The memory device of claim 14, further comprising:
a first access transistor coupled in series with the first transistor and controllable by a voltage on a word line; and
a second access transistor coupled in series with the second transistor and controllable by the voltage on the word line.

16. The memory device of claim 14, wherein the program further includes instructions for:
applying the zero voltage to the first control gate and the second control gate in a first writing phase;
applying a program voltage to the drain of the first transistor and the drain of the second transistor in the first writing phase;
maintaining the first control gate and the second control gate at the zero voltage in a second writing phase;
maintaining the drain of the first transistor at the program voltage in the second writing phase; and
applying a second auxiliary voltage to the drain of the second transistor in the second writing phase.

17. A method for writing a first memory cell of a memory location of an electrically-erasable and programmable memory type, wherein the first memory cell comprises a first transistor having a first control gate, a first floating gate underlying the first control gate, and a first gate dielectric underlying the first floating gate, the memory location further comprising a second memory cell comprising a second transistor having a second control gate, a second floating gate underlying the second control gate, and a second gate dielectric underlying the second floating gate, wherein the second floating gate is coupled to the first floating gate to form a common floating gate, the method comprising:

applying an erase voltage to the first control gate and to the second control gate and applying a zero voltage to a drain of the first transistor and a drain of the second transistor in a first writing phase, wherein an identical tunnel effect is implemented through the first gate dielectric and the second gate dielectric in the first writing phase; and maintaining the zero voltage on the drain of second transistor and applying an auxiliary voltage to the drain of the first transistor in a second writing phase, the auxiliary voltage having a value chosen so as to increase a potential of the first floating gate of the first transistor, and wherein a voltage across the first gate dielectric but not the second gate dielectric is increased in the second writing phase.

18. The method of claim 17, wherein applying the erase voltage to the first control gate and to the second control gate comprises linearly increasing a voltage at the first control gate and the second control gate to the erase voltage.

19. The method of claim 17, wherein the auxiliary voltage is equal to the erase voltage.

20. The method of claim 17, wherein the erase voltage is between 10 volts and 20 volts.

* * * * *